United States Patent
Liang

(10) Patent No.: US 11,256,281 B2
(45) Date of Patent: Feb. 22, 2022

(54) AUTOMATICALLY CONTROLLED BANDGAP REFERENCE CIRCUIT

(71) Applicant: SKYWORKS SOLUTIONS, INC., Irvine, CA (US)

(72) Inventor: Bang Li Liang, Ottawa (CA)

(73) Assignee: Skyworks Solutions, Inc., Irvine, CA (US)

(*) Notice: Subject to any disclaimer, the term of this patent is extended or adjusted under 35 U.S.C. 154(b) by 50 days.

(21) Appl. No.: 16/905,019

(22) Filed: Jun. 18, 2020

(65) Prior Publication Data

US 2020/0401177 A1 Dec. 24, 2020

Related U.S. Application Data

(60) Provisional application No. 62/863,677, filed on Jun. 19, 2019.

(51) Int. Cl.
| G05F 3/30 | (2006.01) |
| G05F 3/22 | (2006.01) |
| G05F 1/46 | (2006.01) |
| G05F 1/595 | (2006.01) |
| H03M 1/00 | (2006.01) |
| G05F 1/567 | (2006.01) |

(52) U.S. Cl.
CPC ............ *G05F 3/30* (2013.01); *G05F 1/468* (2013.01); *G05F 1/567* (2013.01); *H03M 1/001* (2013.01)

(58) Field of Classification Search
CPC .... G05F 3/30; G05F 3/222–245; G05F 1/468; G05F 1/595; G05F 1/462; G05F 3/24–30
See application file for complete search history.

(56) References Cited

U.S. PATENT DOCUMENTS

| 5,072,136 | A | * | 12/1991 | Naghshineh | ......... | H03K 19/086 |
| | | | | | | 326/126 |
| 8,866,536 | B1 | * | 10/2014 | Chen | ......................... | G05F 3/08 |
| | | | | | | 327/512 |
| 2012/0062311 | A1 | * | 3/2012 | Chen | .............. | H03K 19/018521 |
| | | | | | | 327/535 |
| 2013/0169246 | A1 | * | 7/2013 | Shao | ........................ | G05F 1/563 |
| | | | | | | 323/266 |
| 2015/0261234 | A1 | * | 9/2015 | Yang | ........................ | G05F 3/30 |
| | | | | | | 323/313 |
| 2019/0324491 | A1 | * | 10/2019 | Zou | ........................... | H04R 3/00 |
| 2020/0326739 | A1 | * | 10/2020 | Zhao | .................. | H02M 3/33561 |
| 2020/0401167 | A1 | * | 12/2020 | Helmy Zaky | ............. | G05F 1/46 |

* cited by examiner

*Primary Examiner* — Sisay G Tiku
(74) *Attorney, Agent, or Firm* — Chang & Hale LLP

(57) ABSTRACT

Circuits, systems, and methods to automatically switch modes to provide constant reference voltages are discussed herein. For example, a bandgap reference system may include a first bandgap reference circuit configured to provide a first bandgap reference voltage, a low dropout regulator coupled to the first bandgap reference circuit, a temperature circuit coupled to the low dropout regulator, and a second bandgap reference circuit coupled to the low dropout regulator and the temperature circuit. The second bandgap reference circuit may be configured to configure one or more impedance elements based at least in part on a temperature signal and provide a second bandgap reference voltage based on one or more currents that pass through the one or more impedance elements.

18 Claims, 9 Drawing Sheets

AUTOMATICALLY CONTROLLED BANDGAP REFERENCE CIRCUIT

CROSS-REFERENCE TO RELATED APPLICATION(S)

This application claims priority to U.S. Provisional Application No. 62/863,677, filed Jun. 19, 2019 and entitled "Automatically Controlled Bandgap Reference Circuit," the entire contents of which are incorporated herein by reference.

BACKGROUND

Field

The present disclosure relates to bandgap circuits.

Description of the Related Art

Bandgap reference circuits are often used in integrated circuits to generate reference voltages that are relatively constant. For example, a bandgap reference circuit can seek to produce a reference voltage of about 1.25 volts for various temperatures, power supplies, and/or loading. Although existing bandgap reference circuits seek to provide a relatively constant reference voltage, such circuits still produce a reference voltage that is associated with some fluctuation due to changes in temperature, power supply, and/or loading. These fluctuations frequently affect other components that rely on a constant reference voltage. Further, existing bandgap reference circuits occupy a substantial amount of area on an integrated circuit die and take a relatively long time to start-up.

SUMMARY

In accordance with some implementations, the present disclosure relates to a bandgap reference system comprising a first bandgap reference circuit configured to provide a first bandgap reference voltage, a low dropout regulator coupled to the first bandgap reference circuit, a temperature circuit coupled to the low dropout regulator, and a second bandgap reference circuit coupled to the low dropout regulator and the temperature circuit. The low dropout regulator is configured to receive the first bandgap reference voltage and provide a regulated voltage based at least in part on the first bandgap reference voltage. The temperature circuit is configured to receive the regulated voltage and output a temperature signal indicating a temperature. The second bandgap reference circuit is configured to configure one or more impedance elements based at least in part on the temperature signal and provide a second bandgap reference voltage based at least in part on one or more currents that pass through the one or more impedance elements.

In some embodiments, the first bandgap reference circuit is associated with a first amount of reference voltage variation over a temperature range and the second bandgap reference circuit is associated with a second amount of reference voltage variation over the temperature range. The second amount of reference voltage variation is less than the first amount of reference voltage variation.

In some embodiments, the temperature circuit includes a voltage generation circuit configured to generate a Proportional-to-Absolute-Temperature (PTAT) voltage, a slope converter circuit to convert the PTAT voltage, and a voltage follower circuit to output the converted PTAT voltage as the temperature signal.

In some embodiments, the bandgap reference system further comprises an analog-to-digital converter coupled to the temperature circuit. The analog-to-digital converter is configured to receive the temperature signal from the temperature circuit, convert the temperature signal, and provide the converted temperature signal to the second bandgap reference circuit.

In some embodiments, the second bandgap reference circuit includes a current generation circuit configured to generate a Proportional-to-Absolute-Temperature (PTAT) current and provide the PTAT current to a node. The second bandgap reference circuit may include an input bandgap circuit coupled to the node. The input bandgap circuit may be configured to receive an input bandgap reference voltage from the first bandgap reference circuit, convert the input bandgap reference voltage to an input bandgap reference current, and provide a first current to the node based at least in part on the temperature signal. The first current can be associated with the input bandgap reference current. The one or more currents that pass through the one or more impedance elements can include the PTAT current and the first current.

In some embodiments, the second bandgap reference circuit includes one or more transistors coupled to the one or more impedance elements. The second bandgap reference circuit is configured to configure the one or more impedance elements by controlling the one or more transistors based at least in part on the temperature signal.

In some embodiments, the second bandgap reference circuit includes a start-up circuit configured to receive the regulated voltage from the low dropout regulator and power-up the second bandgap reference circuit based at least in part on the regulated voltage.

In some implementations, the present disclosure relates to a bandgap reference circuit comprising a current generation circuit to generate a Proportional-to-Absolute-Temperature (PTAT) current and provide the PTAT current to a node, an input bandgap circuit coupled to the node, and a reference voltage circuit coupled to the node and including one or more impedance elements. The input bandgap circuit is configured to receive an input bandgap reference voltage from another bandgap reference circuit and control a first current to the node based at least in part on a temperature signal. The first current being associated with the input bandgap reference voltage. The reference voltage circuit is configured to configure the one or more impedance elements based at least in part on the temperature signal, receive a second current via the node, and provide an output bandgap reference voltage based at least in part on the second current passing through the one or more impedance elements.

In some embodiments, the bandgap reference circuit is associated with a first amount of reference voltage variation over a temperature range and the other bandgap reference circuit is associated with a second amount of reference voltage variation over the temperature range. The first amount of reference voltage variation is less than the second amount of reference voltage variation.

In some embodiments, the input bandgap circuit includes a voltage-to-current circuit to receive the input bandgap reference voltage from the other bandgap reference circuit and generate an input bandgap reference current based at least in part on the input bandgap reference voltage. The input bandgap circuit may include a current digital-to-analog converter to receive the input bandgap reference current from the voltage-to-current circuit, generate the first current based at least in part on the input bandgap reference current, and provide the first current to the node. The reference voltage circuit may include one or more transistors coupled to the one or more impedance elements. The reference voltage circuit may be configured to configure the one or more impedance elements by controlling the one or more transistors based at least in part on the temperature signal. The bandgap reference circuit may further comprise a start-up circuit coupled to the error amplifier circuit. The start-up circuit may be configured to receive a voltage from a low dropout regulator and power-up the bandgap reference circuit based at least in part on the received voltage. The received voltage may be based at least in part on the input bandgap reference voltage from the other bandgap reference circuit.

In some embodiments, the second current includes the PTAT current and the first current.

In some implementations, the present disclosure relates to a radio-frequency module comprising a packaging substrate configured to receive a plurality of components and a semiconductor die mounted on the packaging substrate. The semiconductor die includes a current generation circuit, an input bandgap circuit coupled to a node, and a reference voltage circuit coupled to the node. The current generation circuit is configured to generate a Proportional-to-Absolute-Temperature (PTAT) current and provide the PTAT current to the node. The input bandgap circuit is configured to receive an input bandgap reference voltage associated with another bandgap reference circuit and control a first current to the node based at least in part on a temperature signal. The first current is associated with the input bandgap reference voltage. The reference voltage circuit includes one or more impedance elements. The reference voltage circuit is configured to configure the one or more impedance elements based at least in part on the temperature signal, receive a second current via the node, and provide an output bandgap reference voltage based at least in part on the second current passing through the one or more impedance elements.

In some embodiments, the radio-frequency module further comprises the other bandgap reference circuit configured to provide the input bandgap reference voltage. The radio-frequency module may further comprise a low dropout regulator coupled to the other bandgap reference circuit. The low dropout regulator may be configured to receive the input bandgap reference voltage and provide a regulated voltage based at least in part on the input bandgap reference voltage. The radio-frequency module may further comprise a temperature circuit coupled to the low dropout regulator. The temperature sensor circuit may be configured to receive the regulated voltage and output the temperature signal.

In some implementations, the present disclosure relates to a radio-frequency device comprising a transceiver to generate a radio-frequency signal, a front-end module coupled to the transceiver and to generate an amplified radio-frequency signal, a bandgap reference circuit to provide an output bandgap reference for the front-end module, and an antenna to transmit the amplified radio-frequency signal. The bandgap reference circuit includes a current generation circuit, an input bandgap circuit coupled to a node, and a reference voltage circuit coupled to the node. The current generation circuit is configured to generate a Proportional-to-Absolute-Temperature (PTAT) current and provide the PTAT current to the node. The input bandgap circuit is configured to receive an input bandgap reference voltage associated with another bandgap reference circuit and control a first current to the node based at least in part on a temperature signal. The first current is associated with the input bandgap reference voltage. The reference voltage circuit includes one or more impedance elements. The reference voltage circuit is configured to configure the one or more impedance elements based at least in part on the temperature signal, receive a second current via the node, and provide the output bandgap reference voltage based at least in part on the second current passing through the one or more impedance elements.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

DETAILED DESCRIPTION

This disclosure is directed to, in part, bandgap reference systems that automatically switch modes to provide constant reference voltages. For example, a bandgap reference system can detect a temperature and select an operating mode based on the temperature. The operating mode can be associated with a temperature range and a specific configuration of impedance elements that is optimized for the temperature range. The bandgap reference system can function based on the operating mode to provide a reference voltage that is substantially constant over the temperature range. The configuration of impedance elements can affect the generation of the reference voltage. As temperature changes outside the temperature range of the selected operating mode, the bandgap reference system can automatically switch to a different operating mode to provide a reference voltage that is substantially constant for another temperature range. As such, the bandgap reference system can operate in different modes to provide a constant reference voltage for a variety of temperatures.

In examples, the bandgap reference systems can provide a reference voltage that varies by a relatively small amount. In one illustration, a bandgap reference system can output a bandgap reference voltage that varies by about 990 μV over a temperature range from −40° C. to 120° C. (exhibiting a temperature coefficient (TC) of about 4.74 ppm/C). In another illustration, a bandgap reference system can output a bandgap reference voltage that varies by about 32 μV over a temperature range from −40° C. to 120° C. (exhibiting a TC of about 0.15 ppm/C). In yet other illustrations, a bandgap reference system can output a bandgap reference voltage that varies by other amounts and/or is associated with other TCs.

Further, in examples, a bandgap reference system can occupy a relatively small amount of area on a semiconductor die, in comparison to other bandgap reference systems. This can enable relatively low mixed-signal coupling. Moreover, a bandgap reference system can be associated with a relatively quick power-up time (e.g., less than 1 μs turn-on/enable time and less than 3 μs power supply ramping time), relatively low current consumption (e.g., a bandgap reference core circuit can use less than 1 mA or 10 μA to operate), relatively low current leakage in an non-operating or sleep state (e.g., less than 10 nA can leak out when the bandgap reference system is in an non-operating or sleep state), relatively low noise (e.g., less than 10 μVrms total noise and 3 μVpp/V low-frequency 1/f noise), relatively good power supply rejection ratio (PSRR), relatively low RF-analog inter-coupling, etc.

The bandgap reference systems discussed herein can be used in a variety of contexts. For example, the bandgap reference systems can be implemented within a component of a radio-frequency device (e.g., a baseband system, a front end module (FEM), etc.), an analog-to-digital converter, and so on.

Figure 1:
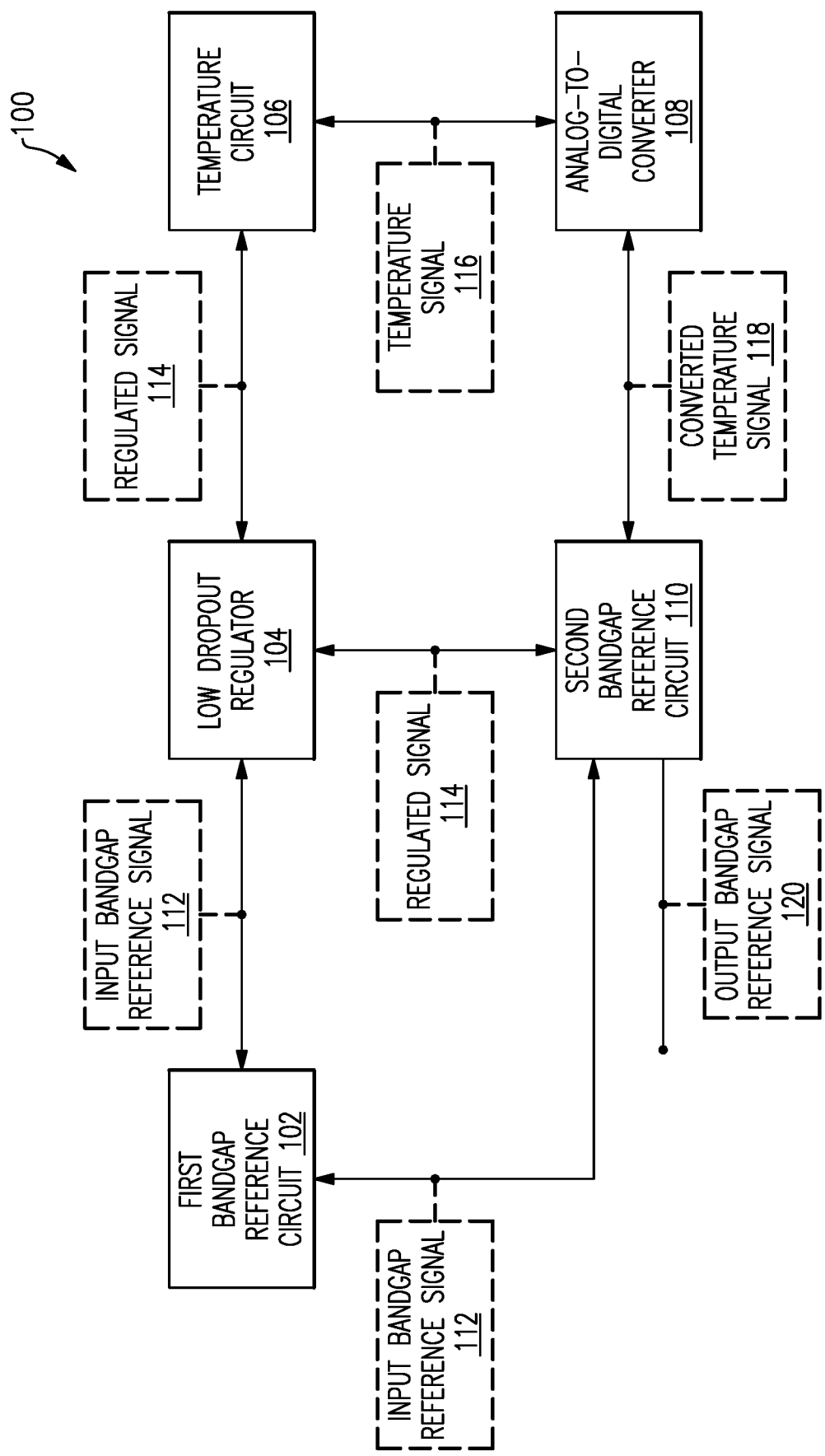
FIG. 1 illustrates an example bandgap reference system that operates in different modes to provide a constant reference voltage in accordance with one or more embodiments.
Figure 2:
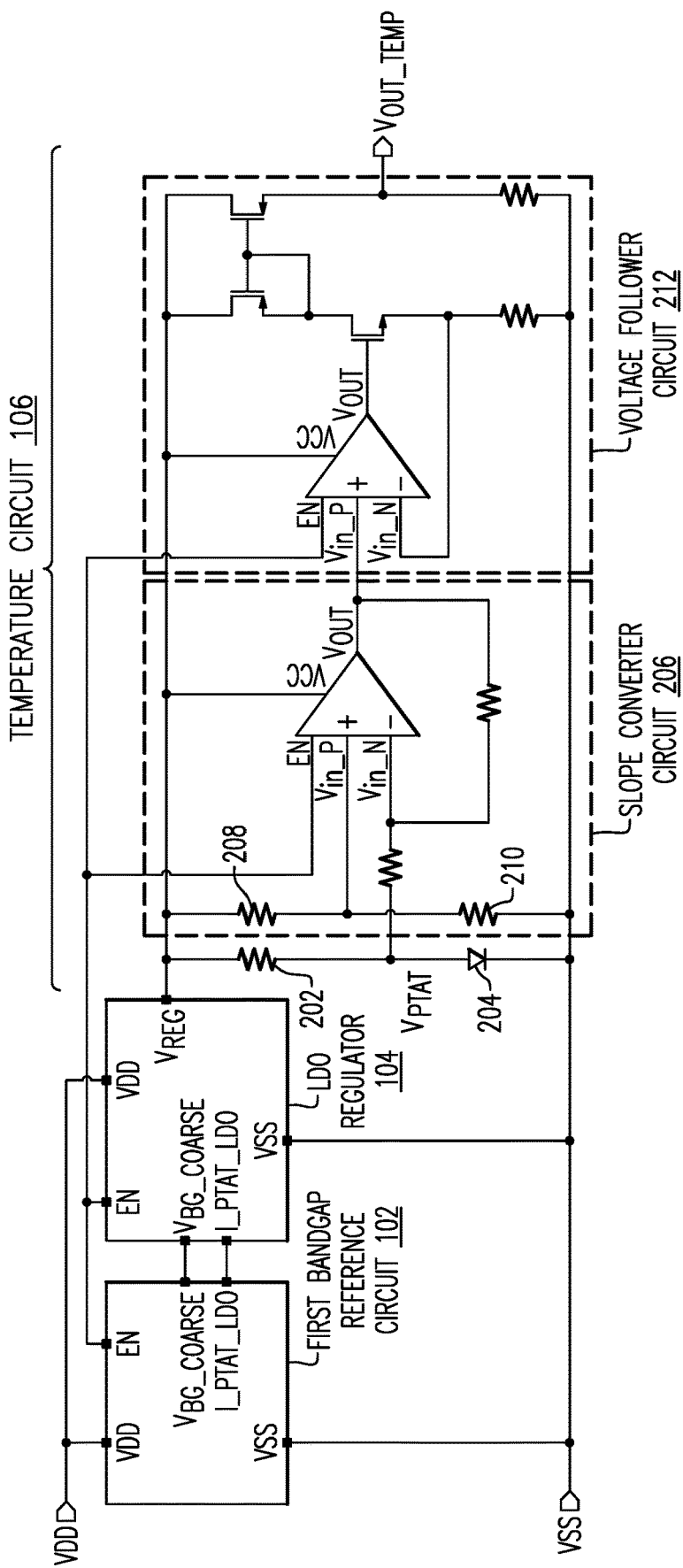
FIG. 2 illustrates an example of the temperature circuit of FIG. 1 in accordance with one or more embodiments.
Figure 3:
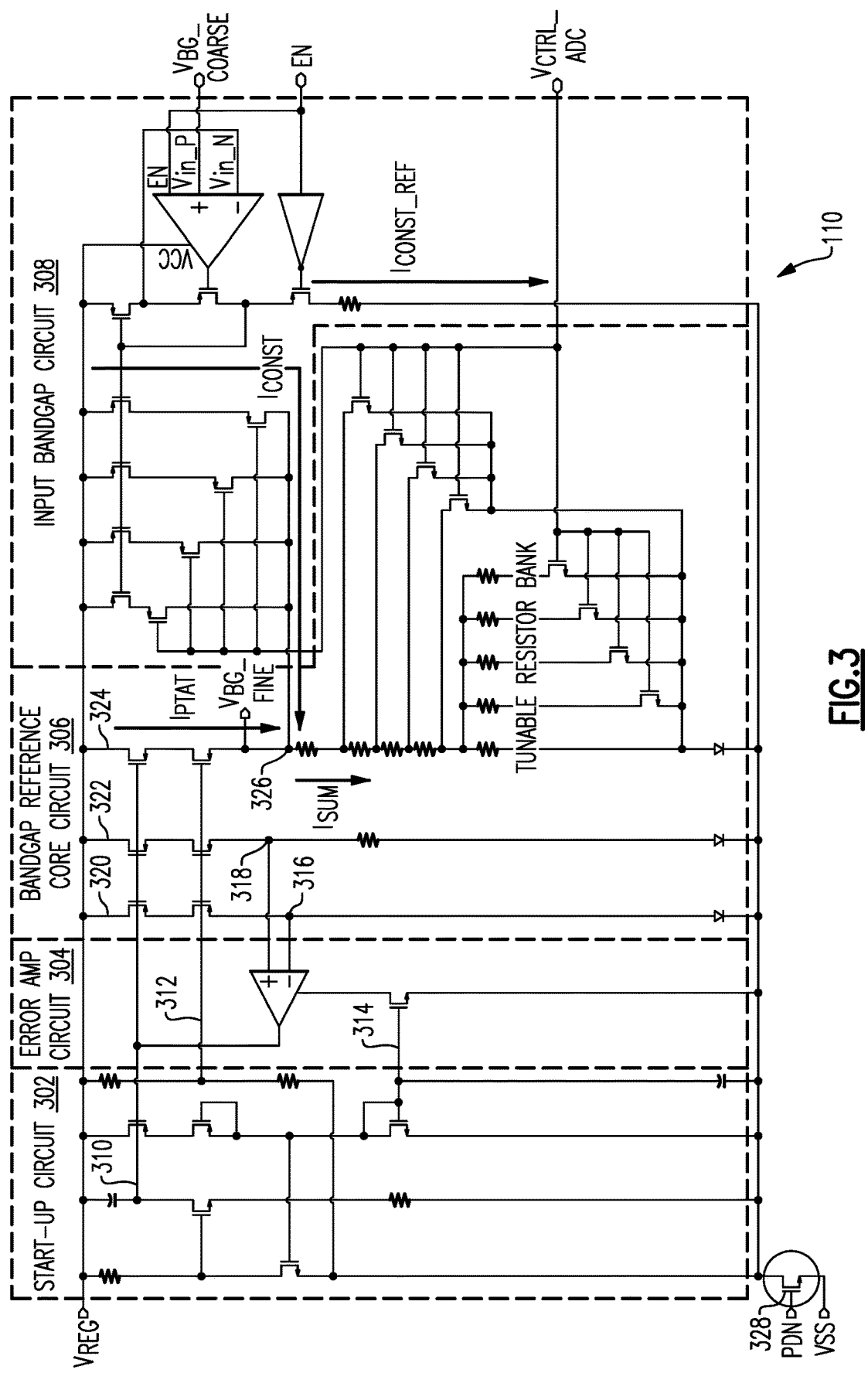
FIG. 3 illustrates an example of the second bandgap reference circuit of FIG. 1 in accordance with one or more embodiments.
Figure 4:
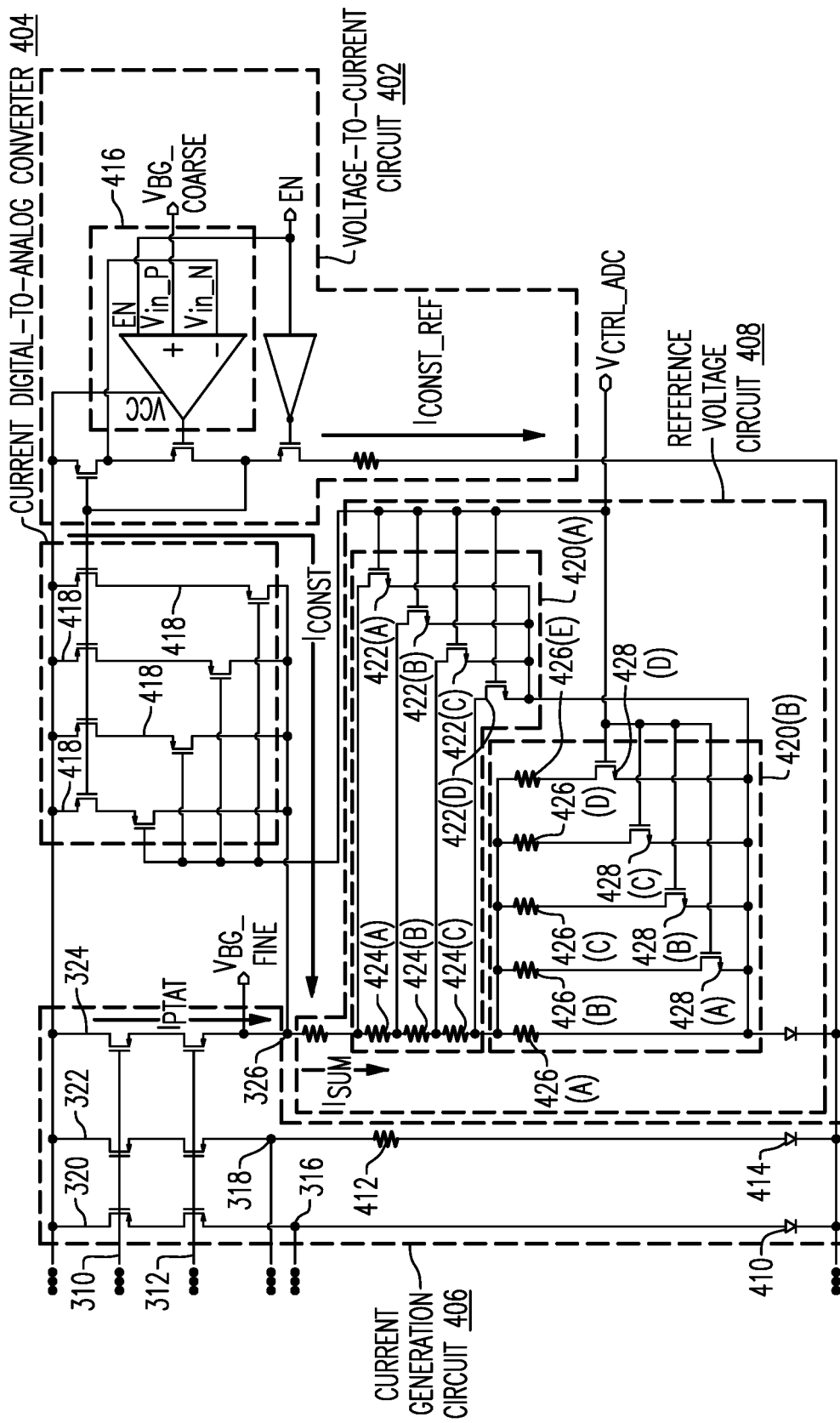
FIG. 4 illustrates an example bandgap reference core circuit and input bandgap circuit in closer detail in accordance with one or more embodiments.
Figure 5:
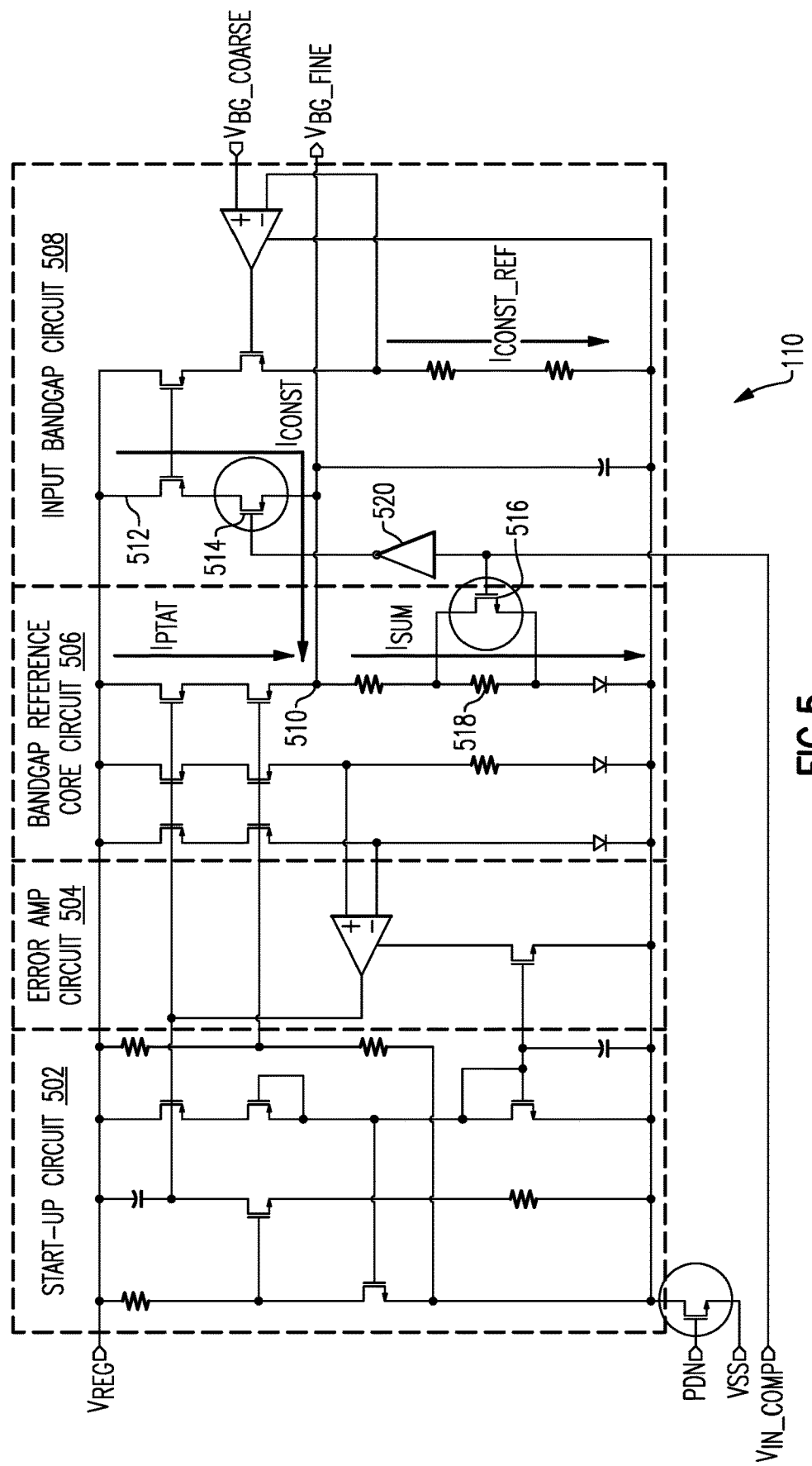
FIG. 5 illustrates another example of the second bandgap reference circuit of FIG. 1 in accordance with one or more embodiments.

FIG. 1 illustrates an example bandgap reference system 100 that operates in different modes to provide a constant reference voltage. As shown, the bandgap reference system 100 includes a first bandgap reference circuit 102 (sometimes referred to as the first bandgap voltage reference circuit 102), a low dropout regulator 104, a temperature circuit 106, an analog-to-digital converter 108, and a second bandgap reference circuit 110 (sometimes referred to as the second bandgap voltage reference circuit 110). In the example of FIG. 1, the first bandgap reference circuit 102 is coupled to the low dropout regulator 104 and the second bandgap reference circuit 110, the low dropout regulator is coupled to the temperature circuit 106 and the second bandgap reference circuit 110, and the analog-to-digital converter 108 is coupled to the second bandgap reference circuit 110. Although any of the first bandgap reference circuit 102, the low dropout regulator 104, the temperature circuit 106, the analog-to-digital converter 108, and/or the second bandgap reference circuit 110 can be coupled to each other. An example of the temperature circuit 106 is illustrated in FIG. 2 and examples of the second bandgap reference circuit 110 are illustrated in FIGS. 3-5.

The first bandgap reference circuit 102 can generate an input bandgap reference signal 112 (e.g., a voltage signal "$V_{BG\_COARSE}$") and provide the input bandgap reference signal 112 to the low dropout regulator 104 and/or the second bandgap reference circuit 110. The low dropout regulator 104 can convert the input bandgap reference signal 112 and provide a regulated signal 114 (e.g., a voltage signal "$V_{REG}$") to the temperature circuit 106 and/or the second bandgap reference circuit 110. The temperature circuit 106 can detect a temperature and provide a temperature signal 116 (e.g., a voltage signal "$V_{OUT\_TEMP}$") indicating the temperature to the analog-to-digital converter 108. The analog-to-digital converter 108 can convert the temperature signal 116 to a converted temperature signal 118 (e.g., a voltage signal "$V_{CTRL\_ADC}$") and provide the converted temperature signal 118 to the second bandgap reference circuit 110. The converted temperature signal 118 can be a digital signal. The second bandgap reference circuit 110 can use the converted temperature signal 118, the regulated signal 114, and/or the input bandgap reference signal 112 to provide an output bandgap reference signal 120 (e.g., a voltage signal "$V_{BG\_FINE}$").

The first bandgap reference circuit 102 can be implemented in a variety of manners. The first bandgap reference circuit 102 can include one or more resistors, transistors (e.g., Bipolar junction transistors (BJTs), field-effect transistors (FETs), etc.), diodes, op-amps, etc. in a variety of configurations to generate the input bandgap reference signal 112. For instance, the first bandgap reference circuit 102 can produce the input bandgap reference signal 112 by combining a voltage that increases with temperature (e.g., a proportional-to-absolute-temperature (PTAT) voltage) with a voltage that decreases with temperature (e.g., a complementary-to-absolute-temperature (CTAT) voltage). The first bandgap reference circuit 102 can receive supply voltage (e.g., VDD) to produce the input bandgap reference signal 112.

In examples, the first bandgap reference circuit 102 provides a more inconsistent bandgap reference signal than the second bandgap reference circuit 110. For instance, the first bandgap reference circuit 102 can be associated with a first amount of reference voltage variation over a temperature range, while the second bandgap reference circuit 110 can be associated with a second amount of reference voltage variation over the same temperature range. The second amount of reference voltage variation can be less than the first amount of reference voltage variation. To illustrate, the input bandgap reference signal 112 provided by the first bandgap reference circuit 102 can vary by about 9 mV over a temperature range from −40° C. to 130° C., exhibiting a Temperature Coefficient (TC) of about 43 ppm/C. Meanwhile, the output bandgap reference signal 120 provided by the second bandgap reference circuit 110 can vary by less than 1 mV (or less than 50 µV) over a temperature range from −40° C. to 130° C., exhibiting a TC of less than 5 ppm/C (or less than 0.2 ppm/C). As such, the output bandgap reference signal 120 is substantially more constant than the input bandgap reference signal 112, in many examples. The input bandgap reference signal 112 can be referred to as a coarse signal, while the output bandgap reference signal 120 can be referred to as a fine signal.

The low dropout regulator (LDO) 104 can be implemented as a voltage regulator that provides an output voltage even when supply voltage is relatively close to the output voltage (e.g., within a threshold amount). The low dropout regulator 104 can include a variety of elements, such as resistors, op-amps, capacitors, transistors, etc. In the example of FIG. 1, the low dropout regulator 104 can receive the input bandgap reference signal 112 and/or a supply voltage (e.g., VDD) and generate the regulated signal 114 based on the input bandgap reference signal 112 and/or the supply voltage. In examples, the low dropout regulator 104 is associated with a relatively high PSRR.

The analog-to-digital converter 108 can convert an input signal into a digital signal and output the digital signal. In the example of FIG. 1, the analog-to-digital converter 108 receives the temperature signal 116 as input, converts the temperature signal 116 to the converted temperature signal 118, and outputs the converted temperature signal 118. Although the analog-to-digital converter 108 is illustrated in FIG. 1, the analog-to-digital converter 108 can be eliminated in some examples. In such examples, the temperature signal 116 can be provided directly to the second bandgap reference circuit 110 or other components.

In one illustration, the input bandgap reference signal 112 is a voltage signal that is about 1.2 V, the regulated signal 114 is a voltage signal that is about 1.8 V, the temperature signal 116 is a voltage signal that is 0.2 V to 1.6 V, and the output bandgap reference signal 120 is a voltage signal that is about 1.2 V. Although, in other illustrations the signals can be other types of signals (e.g., current signals) and/or associated with other values.

FIG. 2 illustrates an example of the temperature circuit 106 of FIG. 1. The temperature circuit 106 can be referred to as a temperature sensor and can provide a junction temperature. In examples, a junction temperature is a temperature of a semiconductor device (e.g., an operating temperature or highest operating temperature of a semiconductor device, such as a transistor). During operation, the junction temperature can be higher than a temperature of a system housing the semiconductor device and/or an exterior temperature of the system, such as a temperature of a case. As illustrated, the temperature circuit 106 is coupled to the low dropout regulator 104 and the low dropout regulator 104 is coupled to the first bandgap reference circuit 102. The first bandgap reference circuit 102, the low dropout regulator 104, and/or the temperature circuit 106 can send or receive signals via one or more connection points, such as one or more contact pads or other conductive points.

In this example, the first bandgap reference circuit 102 and the low dropout regulator 104 each receive a positive power supply voltage VDD, a negative power supply voltage VSS, and an enable signal EN. In one illustration, the positive power supply voltage VDD can be a relatively noisy supply that varies from around 1.8 V to 3.3 V. The enable signal EN is used to enable or disable the first bandgap reference circuit 102 and/or the low dropout regulator 104 (e.g., the enable signal provides a voltage or current signal to activate or deactivate the first bandgap reference circuit 102 and/or the low dropout regulator 104).

The first bandgap reference circuit 102 can generate an input bandgap reference voltage $V_{BG\_COARSE}$ and provide the input bandgap reference voltage $V_{BG\_COARSE}$ to the low dropout regulator 104 via a connection. The input bandgap reference voltage $V_{BG\_COARSE}$ can function as a reference for the low dropout regulator 104. The first bandgap reference circuit 102 can also generate a proportional-to-absolute-temperature (PTAT) current $I_{PTAT\_LDO}$ and provide the PTAT current $I_{PTAT\_LDO}$ to the low dropout regulator 104 via a connection. In examples, the low dropout regulator 104 can use the PTAT current $I_{PTAT\_LDO}$ as a biasing current for an error amplifier in the low dropout regulator 104. The low dropout regulator 104 can generate a regulated signal $V_{REG}$ (e.g., regulated voltage signal) based on the input bandgap reference voltage $V_{BG\_COARSE}$, the supply voltage VDD, and/or the PTAT current $I_{PTAT\_LDO}$. The low dropout regulator 104 can provide the regulated signal $V_{REG}$ to the temperature circuit 106.

The temperature circuit 106 can include a voltage generation circuit to generate a voltage $V_{PTAT}$ based on the regulated signal $V_{REG}$. The voltage generation circuit can include a resistor 202 and/or a diode 204. A voltage drop across the diode 204 can produce the voltage $V_{PTAT}$, which is a $P_{TAT}$ voltage. That is, the voltage $V_{PTAT}$ across the diode 204 fluctuates with temperature, so that the voltage $V_{PTAT}$ is proportional to temperature at the diode 204. The voltage $V_{PTAT}$ can be linearly proportion to the temperature. In examples, the voltage generation circuit can be implemented as a diode-poly resistor PTAT generator.

The temperature circuit 106 can also include a slope converter circuit 206 coupled to the voltage generation circuit. The slope converter circuit 206 can convert the voltage $V_{PTAT}$ to provide a wider range of output voltages. As shown, the slope converter circuit 206 can include an op-amp that receives the voltage $V_{PTAT}$ and a voltage produced by a drop of the regulated signal $V_{REG}$ (e.g., voltage signal) across resistors 208 and 210. The VCC connection of the op-amp can be connected to the regulated signal $V_{REG}$. The op-amp can be implemented as a negative feedback op-amp. The op-amp can provide a wider range of output voltages than the diode 204. As shown, the slope converter circuit 206 can also be connected to the negative power supply voltage VSS.

The temperature circuit 106 can also include a voltage follower circuit 212 coupled to the slope converter circuit 206. The voltage follower circuit 212 can buffer the voltage received from the slope converter circuit 206. The voltage follower circuit 212 can include an op-amp, resistors, transistors, and/or other elements. The voltage follower circuit 212 can provide low output impedance to a circuit coupled to the voltage follower circuit 212, such as the analog-to-digital converter 108, the second bandgap reference circuit 110, or another circuit. As illustrated, the voltage follower circuit 212 can output a temperature signal $V_{OUT\_TEMP}$ (e.g., a voltage signal). As shown, the voltage follower circuit 212 can also be connected to the regulated signal $V_{REG}$ and the negative power supply voltage VSS.

As noted above, the temperature circuit 106 can implement the slope converter circuit 206 to provide a relatively wide range of output signals. For example, the temperature circuit 106 can provide a temperature signal $V_{OUT\_TEMP}$ in a range from about 0.2 V to 1.6 V for a temperature range from −40° C. to 120° C. In examples, the temperature signal $V_{OUT\_TEMP}$ can be provided to the analog-to-digital converter 108. By providing a relatively wide range of output signals, the analog-to-digital converter 108 can operate over a larger operating range (e.g., in comparison to a signal from a temperature circuit that does not include the slope converter circuit 206). This can allow the analog-to-digital converter 108 to produce a digital signal (e.g., a converted temperature signal $V_{CTRL\_ADC}$) that more accurately reflects temperature.

In examples, the temperature circuit 106 can be implemented on a same semiconductor die as the second bandgap reference circuit 110. This can provide a relatively accurate temperature signal for controlling the second bandgap reference circuit 110 (e.g., a temperature signal that accurately reflects a temperature of the second bandgap reference circuit 110).

Although the slope converter circuit 206 and/or the voltage follower circuit 212 are shown in FIG. 2 with example configurations of elements, other configurations and/or elements are also possible.

FIG. 3 illustrates an example of the second bandgap reference circuit 110 of FIG. 1. The second bandgap reference circuit 110 can include a start-up circuit 302, an error amplifier circuit 304 coupled to the start-up circuit 302, a bandgap reference core circuit 306 coupled to the start-up circuit 302 and the error amplifier circuit 304, and an input bandgap circuit 308 coupled to the bandgap reference core circuit 306. The start-up circuit 302, the error amplifier circuit 304, the bandgap reference core circuit 306, and/or the input bandgap circuit 308 can receive a regulated signal $V_{REG}$ from the low dropout regulator 104 and/or receive a negative power supply voltage VSS.

The start-up circuit 302 can power-up the second bandgap reference circuit 110 based on the regulated signal $V_{REG}$. For example, the start-up circuit 302 can receive the regulated signal $V_{REG}$ from the low dropout regulator 104 and produce one or more bias voltages for the error amplifier circuit 304 and/or the bandgap reference core circuit 306. In particular, the start-up circuit 302 can produce voltages on conductive paths 310, 312, and/or 314 in order to bias elements of the error amplifier circuit 304 and/or the bandgap reference core circuit 306 (e.g., transistors of the circuits). This can set the error amplifier circuit 304 and/or the bandgap reference core circuit 306 to an operational state. In a powered-up state (i.e., operational state), the second bandgap reference circuit 110 can produce an output bandgap reference signal. In examples, since the start-up circuit 302 powers-up from the regulated signal $V_{REG}$, the start-up circuit 302 can power-up the bandgap reference circuit 110 more quickly than if the bandgap reference circuit 110 were to power-up from 0 V.

The bandgap reference core circuit 306 can provide an output bandgap reference signal $V_{BG\_FINE}$ based on signals from the start-up circuit 302, the error amplifier circuit 304, and/or the input bandgap circuit 308. For example, the bandgap reference core circuit 306 can operate in cooperation with the error amplifier circuit 304 (and/or the start-up circuit 302) to produce a current $I_{PTAT}$. As illustrated, the error amplifier circuit 304 can include an op-amp connected to receive inputs from nodes 316 and 318 along conductive paths 320 and 322, respectively. The output of the op-amp can be connected to the conductive path 310. In examples, the op-amp can be implemented as a high gain amplifier (e.g., to amplify a signal by more than a threshold amount). However, other types of amplifiers can be used. The op-amp and/or the feedback effect can force the nodes 316 and 318 to have essentially the same voltage potential. A PTAT current can also flow through each of conductive paths 320 and 322. The PTAT current in each of the conductive paths 320 and 322 can be substantially the same. This PTAT current is mirrored to a conductive path 324, creating the current $I_{PTAT}$ that is passed to a node 326. The conductive paths 320, 322, and 324 can be referred to as branches 320, 322, and 324, respectively.

The bandgap reference core circuit 306 can also receive a current $I_{CONST}$ from the input bandgap circuit 308. The current $I_{CONST}$ can be provided to the node 326 to create a current $I_{SUM}$. For example, the input bandgap circuit 308 can receive an input bandgap reference voltage $V_{BG\_COARSE}$ from the first bandgap reference circuit 102, convert the input bandgap reference voltage $V_{BG\_COARSE}$ to an input bandgap reference current $I_{CONST\_REF}$, and provide a current $I_{CONST}$ based a converted temperature signal $V_{CTRL\_ADC}$ from the analog-to-digital converter 108. The current $I_{CONST}$ can be associated with the input bandgap reference current $I_{CONST\_REF}$. The current $I_{CONST}$ can be provided to the node 326. A combination of the current $I_{CONST}$ and the current $I_{PTAT}$ can be referred to as the current $I_{SUM}$. Although illustrated in FIG. 3, in some examples, the current $I_{CONST}$ is not provided to the node 326 and the current $I_{SUM}$ is the same as the current $I_{PTAT}$.

The bandgap reference core circuit 306 can produce an output bandgap reference signal $V_{BG\_FINE}$ by configuring one or more impedance elements and allowing the current $I_{SUM}$ to pass through the one or more impedance elements. For example, the bandgap reference core circuit 306 can include one or more switches (e.g., transistors) that are controlled based on a converted temperature signal $V_{CTRL\_ADC}$ from the analog-to-digital converter 108. The switches can affect a flow of the current $I_{SUM}$ through one or more impedance elements (e.g., resistors, capacitors, inductors, etc.). A drop of voltage across the one or more impedance elements can produce an output bandgap reference signal $V_{BG\_FINE}$ (e.g., a voltage signal). Further details of the bandgap reference core circuit 306 and input bandgap circuit 308 are discussed below in reference to FIG. 4.

In examples, the second bandgap reference circuit 110 includes a low-leakage transistor 328 to control potential current leakage from the second bandgap reference circuit 110. For example, a control system, such as a Power Distribution Network (PDN), can control a gate of the low-leakage transistor 328 to (i) place the low-leakage transistor 328 in an OFF state (e.g., non-conducting state) when the second bandgap reference circuit 110 is in a non-operating or sleep state and (ii) place the low-leakage transistor 328 in an ON state (e.g., conducting state) when the second bandgap reference circuit 110 is in an operating state. This can minimize current leakage out of the second bandgap reference circuit 110 when the second bandgap reference circuit 110 is not operating or is asleep and some current leaks through other elements of the second bandgap reference circuit 110 down to the low-leakage transistor 328. In examples, the low-leakage transistor 328 allows less than 50 nA, 10 nA, or 7 nA of current to leak out of the second bandgap reference circuit 110 (e.g., less than 50 nA, 10 nA, or 7 nA leak through the low-leakage transistor 328 when the low-leakage transistor 328 is in an OFF state). In examples, the low-leakage transistor 328 can assist in isolating the second bandgap circuit 110 from other components.

FIG. 4 illustrates the bandgap reference core circuit 306 and the input bandgap circuit 308 in closer detail. The input bandgap circuit 308 can include a voltage-to-current circuit 402 and a current digital-to-analog converter 404. The bandgap reference core circuit 306 can include a current generation circuit 406 and a reference voltage circuit 408.

The voltage-to-current circuit 402 can receive an input bandgap reference voltage $V_{BG\_COARSE}$ from the first bandgap reference circuit 102 and generate an input bandgap reference current $I_{CONST\_REF}$ based on the input bandgap reference voltage $V_{BG\_COARSE}$. In particular, the voltage-to-current circuit 402 can include an op-amp 416 that receives the input bandgap reference voltage $V_{BG\_COARSE}$ and an enable signal EN (via a pad). The enable signal EN can activate the op-amp 416. The op-amp 416 can be configured as a negative feedback op-amp and/or a relatively high-gain op-amp. Further, the op-amp 416 can be associated with relatively high PSRR, low noise, high speed, and/or low offset. The voltage-to-current circuit 402 can also include transistors, a resistor, and/or an inverter. The inverter can receive the enable signal EN. With such configuration, the voltage-to-current circuit 402 can convert the input bandgap reference voltage $V_{BG\_COARSE}$ to the input bandgap reference current $I_{CONST\_REF}$. The input bandgap reference current $I_{CONST\_REF}$ can be mirrored to the current digital-to-analog converter 404.

The current digital-to-analog converter 404 can generate a current $I_{CONST}$ based on the input bandgap reference current $I_{CONST\_REF}$ and/or a temperature signal. For example, the input bandgap reference current $I_{CONST\_REF}$ can be mirrored from the voltage-to-current circuit 402 to each of conductive paths 418 (also referred to as the branches 418) based on upper transistors on the branches 418. Further, each of lower transistors on the branches 418 can receive a temperature signal and control, based on the temperature signal, an amount of the current $I_{CONST}$ that passes through the respective lower transistor to the node 326. In the example of FIG. 4, the temperature signal is received from the analog-to-digital converter 108 as the converted temperature signal $V_{CTRL\_ADC}$. However, the temperature signal can be received from the temperature circuit 106 as the temperature signal $V_{OUT\_TEMP}$. As such, each of the lower transistors on the branches 418 can be coupled to the analog-to-digital converter 108 and/or the temperature circuit 106. Although four branches 418 are illustrated in FIG. 4, any number of branches can be implemented.

In some examples, each of the lower transistors in the branches 418 can be controlled in an independent manner to provide current. Here, the lower transistors of the branches 418 can be placed an in ON state based on different amounts of bias voltages. To illustrate, a lower transistor of a first branch can be placed in an ON state (allowing the current $I_{CONST\_REF}$ to flow through the first branch to the node 326) when the converted temperature signal $V_{CTRL\_ADC}$ is greater than a first threshold. Further, a lower transistor of a second branch can be placed in an ON state (allowing the current $I_{CONST\_REF}$ to flow through the second branch to the node 326) when the converted temperature signal $V_{CTRL\_ADC}$ is greater than a second threshold. In this illustration, if the converted temperature signal $V_{CTRL\_ADC}$ is greater than the second threshold, a total amount of current that is provided to the node 326 (i.e., the current $I_{CONST}$) is a sum of the current from the first branch and the current from the second branch (e.g., $2 \times I_{CONST\_REF}$).

In other examples, the lower transistors in the branches 418 can be controlled in a group manner to provide current. Here, each of the lower transistors in the branches 418 can operate in the linear region to incrementally increase or decrease current flow as the converted temperature signal $V_{CTRL\_ADC}$ changes. To illustrate, a first branch can provide a portion of the current $I_{CONST\_REF}$ and a second branch can provide a same portion of the current $I_{CONST\_REF}$ when the converted temperature signal $V_{CTRL\_ADC}$ is greater than a threshold. In this illustration, a total amount of current that is provided to the node 326 (i.e., the current $I_{CONST}$) is a sum of the current from the first branch and the current from the second branch.

The current generation circuit 406 can generate a PTAT current $I_{PTAT}$ and provide the current $I_{PTAT}$ to the node 326. The current generation circuit 406 can include a first pair of cascoded transistors located on the conductive path 320, a second pair of cascoded transistors located the conductive path 322, and third pair of cascoded transistors located on the conductive path 324. Although not illustrated in FIG. 4, the op-amp of the error amplifier circuit 304 can also be part of the current generation circuit 406. In the example of FIG. 4, the conductive path 320 can include a diode 410 coupled to the first pair of cascoded transistors and the conductive path 322 can include a resistor 412 and a diode 414 coupled to the second pair of cascoded transistors. In examples, the diode 410 can be associated with different current densities and/or area than the diode 414. To illustrate, the diode 414 can have a lower current density (due to a larger area) than the diode 410. With such configuration, the current generation circuit 406 can generate a CTAT voltage by tapping the diode 410 and generate a PTAT voltage using a difference in voltages for the diodes 410 and 414. As noted above, a same amount of current flows through each of the conductive paths 320 and 322. The current is a PTAT current, which is mirrored to the conductive path 324 as the illustrated current $I_{PTAT}$. The current $I_{PTAT}$ is passed to the node 326.

Although the current generation circuit 406 is illustrated with transistors and diodes, in other examples the current generation circuit 406 can be implemented with other elements, such as BJTs, etc.

The reference voltage circuit 408 can control a flow of a current through one or more impedance elements to generate an output bandgap reference signal $V_{BG\_FINE}$. As illustrated, the reference voltage circuit 408 can receive a current $I_{SUM}$ via the node 326. The current $I_{SUM}$ can include the current $I_{PTAT}$ from the current generation circuit 406 and/or the current $I_{CONST}$ (if any) from the current digital-to-analog circuit 404. The reference voltage circuit 408 can include impedance sections 420 that are controlled to affect the flow of the current $I_{SUM}$ and to generate the output bandgap reference signal $V_{BG\_FINE}$. The impedance sections 420 include transistors and impedance elements that are controlled based on a temperature signal. An impedance element can include a variety of elements that affect the flow of current, such as resistors, capacitors, inductors, etc. In the example of FIG. 4, the temperature signal is received from the analog-to-digital converter 108 as the converted temperature signal $V_{CTRL\_ADC}$. However, the temperature signal can be received from the temperature circuit 106 as the temperature signal $V_{OUT\_TEMP}$. As such, each of the transistors in the impedance sections 420 can be coupled to the analog-to-digital converter 108 and/or the temperature circuit 106.

The impedance section 420(A) includes transistors 422 that control the flow of current through impedance elements 424 and/or through the impedance section 420(B). The impedance elements 424 (illustrated as resistors 424 in FIG. 4) are coupled in series. In some examples, the transistors 422 are controlled in an independent manner to bypass one or more of the impedance elements 424 and/or the impedance section 420(B). To illustrate, if the temperature signal $V_{CTRL\_ADC}$ is above (or below) a first threshold (e.g., indicating a first temperature), the transistor 422(D) can be placed in an ON state, while the transistors 422(A)-422(C) remain in an OFF state. Here, the current $I_{SUM}$ can pass through the impedance elements 424(A)-424(C), pass through the transistor 422(D), and bypass the impedance section 420(B). Further, if the temperature signal $V_{CTRL\_ADC}$ is above (or below) a second threshold (e.g., indicating a second temperature), the transistor 422(C) can be placed in an ON state, while the transistors 422(A) and 422(B) remain in an OFF state. Here, the current $I_{SUM}$ can pass through the impedance elements 424(A) and 424(B), pass through the transistor 422(C) (bypassing the impedance element 424 (C)), and bypass the impedance section 420(B).

In other examples, the transistors 422 are controlled in a group manner. To illustrate, each of the transistors 422 can operate in the linear region to control current flow. As such, current passing through the transistors 422 and the impedance elements 424 can incrementally increase or decrease as the converted temperature signal $V_{CTRL\_ADC}$ changes.

The impedance section 420(B) includes transistors 426 that control the flow of current through impedance elements 428 that are coupled in parallel (resistors 428 in the example of FIG. 4). In some examples, the transistors 428 are controlled in an independent manner to bypass one or more of the impedance elements 426. To illustrate, if the converted temperature signal $V_{CTRL\_ADC}$ is above (or below) a first threshold (e.g., indicating a first temperature), the transistor 428(A) can be placed in an ON state, while the transistors 428(B)-422(E) remain in an OFF state. Here, the current $I_{SUM}$ can be divided and pass through two branches (a branch that includes the impedance element 426(A) and a branch that includes the impedance element 426(B)). Further, if the converted temperature signal $V_{CTRL\_ADC}$ is above (or below) a second threshold (e.g., indicating a second temperature), the transistor 428(B) can be placed in an ON state, while the transistor 426(A) remains in an ON state and the transistors 428(C)-422(E) remain in an OFF state. Here, the current $I_{SUM}$ can be divided and pass through three branches (a branch that includes the impedance element 426(A), a branch that includes the impedance element 426(B), and a branch that includes the impedance element 426(C)).

In other examples, the transistors 428 are controlled in a group manner. To illustrate, each of the transistors 428 can operate in the linear region to control current flow. As such, current passing through the impedance elements 426 and the transistors 428 can incrementally increase or decrease as the converted temperature signal $V_{CTRL\_ADC}$ changes (e.g., current can be divided and passed through the four branches associated with the transistors 428(A)-428(E) in a substantially equal manner).

In general, the reference voltage circuit 408 and/or the current digital-to-analog converter 404 can be controlled to maintain the output bandgap reference signal $V_{BG\_FINE}$ at substantially the same voltage for various temperatures. For example, the transistors 422 and/or 428 can control a configuration of one or more the impedance elements 424 and/or 426 (e.g., control conducting paths for current), thereby increasing or decreasing an amount of resistance through which the current $I_{SUM}$ passes. Additionally, or alternatively, the current digital-to-analog converter 404 can control an amount of current flowing through one or more of the branches 418 to the node 326.

Although the impedance sections 420 are shown in FIG. 4 to include a particular number of transistors and impedance elements, any number of transistors or impedance elements can be implemented. Further, the transistors or impedance elements can be associated with a wide variety of characteristics (e.g., thresholds, resistance values, etc.) to satisfy a variety of contexts.

FIG. 5 illustrates another example of the second bandgap reference circuit 110 of FIG. 1. The second bandgap reference circuit 110 of FIG. 5 includes a start-up circuit 502, an error amplifier circuit 504, a bandgap reference core circuit 506, and an input bandgap circuit 508. The second bandgap reference circuit 110 of FIG. 5 is similar to the second bandgap reference circuit 110 of FIGS. 3 and 4. In particular, the start-up circuit 502 is similar to the start-up circuit 302 and the error amplifier circuit 504 is similar to the error amplifier circuit 304, while the bandgap reference core circuit 506 and the input bandgap circuit 508 are somewhat different than the bandgap reference core circuit 306 and the input bandgap circuit 308.

The bandgap reference core circuit 506 can generate a current $I_{PTAT}$ in a similar manner as that discussed above. The bandgap reference core circuit 506 can provide the current $I_{PTAT}$ to a node 510.

The input bandgap circuit 508 can produce a current $I_{CONST}$ and provide the current $I_{CONST}$ to the bandgap reference core circuit 506. For example, the input bandgap circuit 508 can receive an input bandgap reference voltage $V_{BG\_COARSE}$ from the first bandgap reference circuit 102, convert the input bandgap reference voltage $V_{BG\_COARSE}$ to an input bandgap reference current $I_{CONST\_REF}$, and provide a current $I_{CONST}$ based a temperature signal. The current $I_{CONST}$ can be associated with the input bandgap reference current $I_{CONST\_REF}$. For example, the input bandgap reference current $I_{CONST\_REF}$ can be mirrored to a conductive path 512 (also referred to as the branch 512). A transistor 514 can be controlled based on a temperature signal to allow the input bandgap reference current $I_{CONST\_REF}$ to pass through to the node 510 as the current $I_{CONST}$. For example, the transistor 514 can be placed in an ON state (and allow flow of current) when the temperature signal is above (or below) a threshold. A combination of the current $I_{CONST}$ and the current $I_{PTAT}$ is referred to as the current $I_{SUM}$. Although illustrated in FIG. 5, in some examples, the current $I_{CONST}$ is not provided to the node 510 and the current $I_{SUM}$ is the same as the current $I_{PTAT}$.

As illustrated, the bandgap reference core circuit 506 can include a transistor 516 to control an impedance element 518. For example, the transistor 516 can be controlled based on a temperature signal to cause the current $I_{SUM}$ to flow through a first branch including the transistor 516 or a second branch including the impedance element 518. This affects the output bandgap reference signal $V_{BG\_FINE}$. In the example of FIG. 5, an inverter 520 is used to assist in controlling and the transistors 514 and 516.

In the example of FIG. 5, the temperature signal is a signal $V_{IN\_COMP}$ from a comparator. Here, the comparator can receive the converted temperature signal $V_{CTRL\_ADC}$ from the analog-to-digital converter 108 and compare the converted temperature signal $V_{CTRL\_ADC}$ to a threshold. The signal $V_{IN\_COMP}$ can indicate that the converted temperature signal $V_{CTRL\_ADC}$ is above or below the threshold (e.g., a binary signal). However, in other examples the temperature signal that controls the transistors 514 and 516 is the converted temperature signal $V_{CTRL\_ADC}$ from the analog-to-digital converter 108 and/or the temperature signal $V_{OUT\_TEMP}$ from the temperature circuit 106.

As such, the bandgap reference core circuit 506 and/or the input bandgap circuit 508 can be control based on a temperature signal to maintain an output bandgap reference signal $V_{BG\_FINE}$ at substantially the same voltage. In examples, the second bandgap reference circuit 110 of FIG. 5 is implemented as a dual-mode bandgap reference circuit to operate in two modes. In comparison, the second bandgap reference circuit 110 of FIGS. 3 and 4 can operate in more than two modes.

FIGS. 6A-6E illustrate example graphs of output bandgap reference signals for various types of bandgap reference systems. Each of these graphs illustrate an output bandgap reference signal $V_{BG\_FINE}$ in volts (y-axis) with respect to temperature in degrees Celsius (x-axis). Although FIGS. 6A-6E provide information with respect to a particular number of modes and/or temperature ranges, any number of modes and/or temperature ranges can be implemented.

Figure 6A:
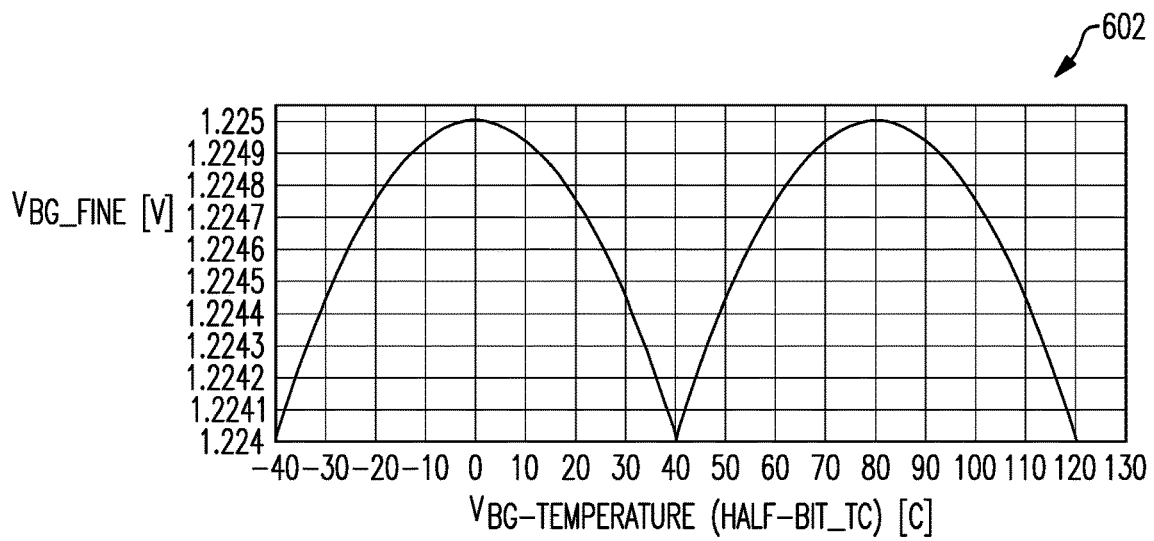
FIG. 6A illustrates an example graph of an output bandgap reference signal for a bandgap reference system that can implement two modes of operation in accordance with one or more embodiments.

FIG. 6A illustrates an example graph 602 of an output bandgap reference signal for a bandgap reference system that can implement two modes of operation. For example, the bandgap reference system can implement a first mode for a temperature range from −40° C. to 40° C. and implement a second mode for a temperature range from 40° C. to 120° C. Here, the bandgap reference system can automatically switch from the first mode to the second mode when the temperature rises above 40° C., and/or automatically switch from the second mode to the first mode when the temperature drops below 40° C. As illustrated, the temperatures 0° C. and 80° C. represent zero-temperature coefficient (TC) points. As also illustrated, the output bandgap reference voltage $V_{BG\_FINE}$ varies by about 990 µV over the temperature range from −40° C. to 120° C. (exhibiting a TC of about 4.74 ppm/C).

Figure 6B:
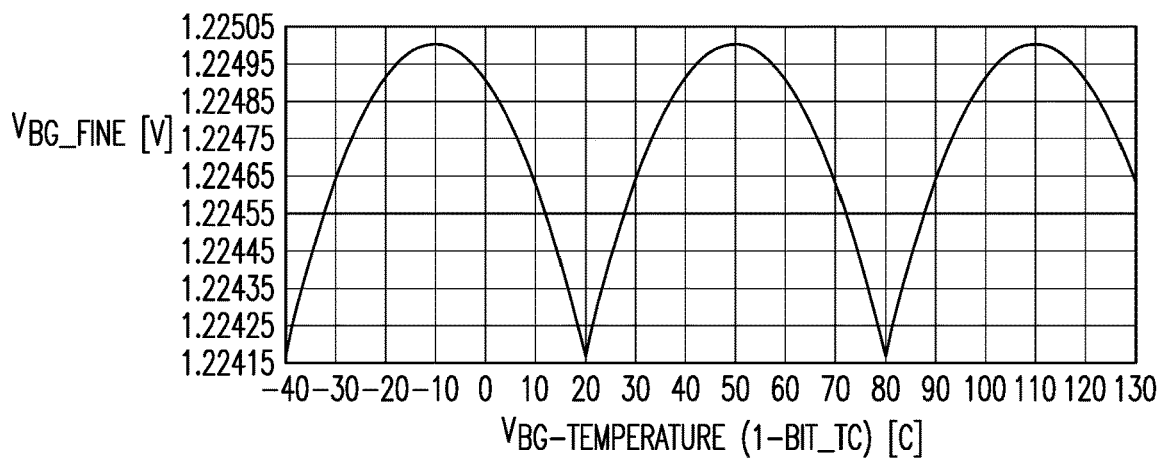
FIG. 6B illustrates an example graph of an output bandgap reference signal for a bandgap reference system that can implement three modes of operation in accordance with one or more embodiments.

FIG. 6B illustrates an example graph 604 of an output bandgap reference signal for a bandgap reference system that can implement three modes of operation. For example, the bandgap reference system can implement a first mode for a temperature range from −40° C. to 20° C., a second mode for a temperature range from 20° C. to 80° C., and a third mode for a temperature range from 80° C. to above 130° C. Here, the bandgap reference system can automatically switch modes at 20° C. and 80° C. As illustrated, the temperatures −10° C., 50° C., and 110° C. represent zero-TC points. As also illustrated, the output bandgap reference voltage $V_{BG\_FINE}$ varies by about 830 µV over the temperature range from −40° C. to 120° C. (exhibiting a TC of about 4.00 ppm/C).

Figure 6C:
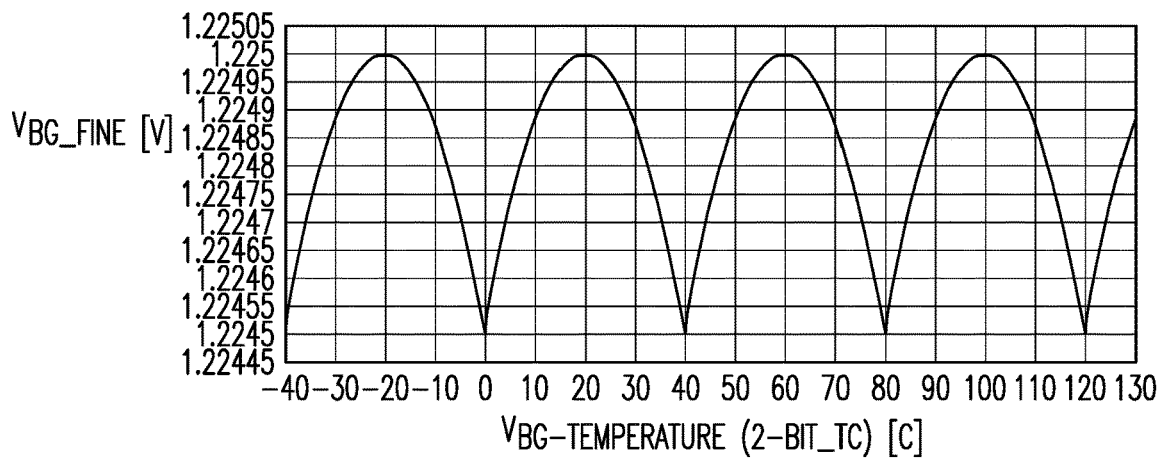
FIG. 6C illustrates an example graph of an output bandgap reference signal for a bandgap reference system that can implement at least four modes of operation in accordance with one or more embodiments in accordance with one or more embodiments.

FIG. 6C illustrates an example graph 606 of an output bandgap reference signal for a bandgap reference system that can implement at least four modes of operation. For example, the bandgap reference system can implement a first mode for a temperature range from −40° C. to 0° C., a second mode for a temperature range from 0° C. to 40° C., a third mode for a temperature range from 40° C. to 80° C., and a fourth mode for a temperature range from 80° C. to 120° C. Here, the bandgap reference system can automatically switch modes at 0° C., 40° C., 80° C., and 120° C. As illustrated, the temperatures −20° C., 20° C., 60° C., and 100° C. represent zero-TC points. As also illustrated, the output bandgap reference voltage $V_{BG\_FINE}$ varies by about 450 µV over the temperature range from −40° C. to 120° C. (exhibiting a TC of about 2.14 ppm/C).

Figure 6D:
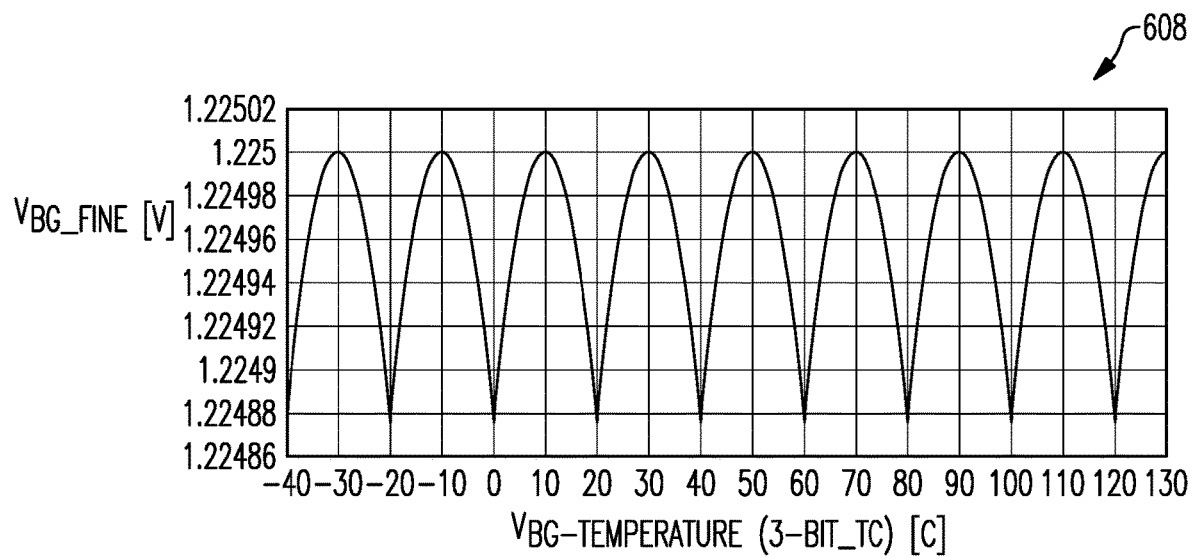
FIG. 6D illustrates an example graph of an output bandgap reference signal for a bandgap reference system that can implement at least eight modes of operation in accordance with one or more embodiments.

FIG. 6D illustrates an example graph 608 of an output bandgap reference signal for a bandgap reference system that can implement at least eight modes of operation. For example, the bandgap reference system can implement a first mode for a temperature range from −40° C. to −20° C., a second mode for a temperature range from −20° C. to 0° C., a third mode for a temperature range from 0° C. to 20° C., and so on. Here, the bandgap reference system can automatically switch modes at −20° C., 0° C., 20° C., 40° C., 60° C., 80° C., 100° C., and 120° C. As illustrated, the temperatures −30° C., −10° C., 10° C., 30° C., 50° C., 70° C., 90° C., and 110° C. represent zero-TC points. As also illustrated, the output bandgap reference voltage $V_{BG\_FINE}$ varies by about 125 µV over the temperature range from −40° C. to 120° C. (exhibiting a TC of about 0.59 ppm/C).

Figure 6E:
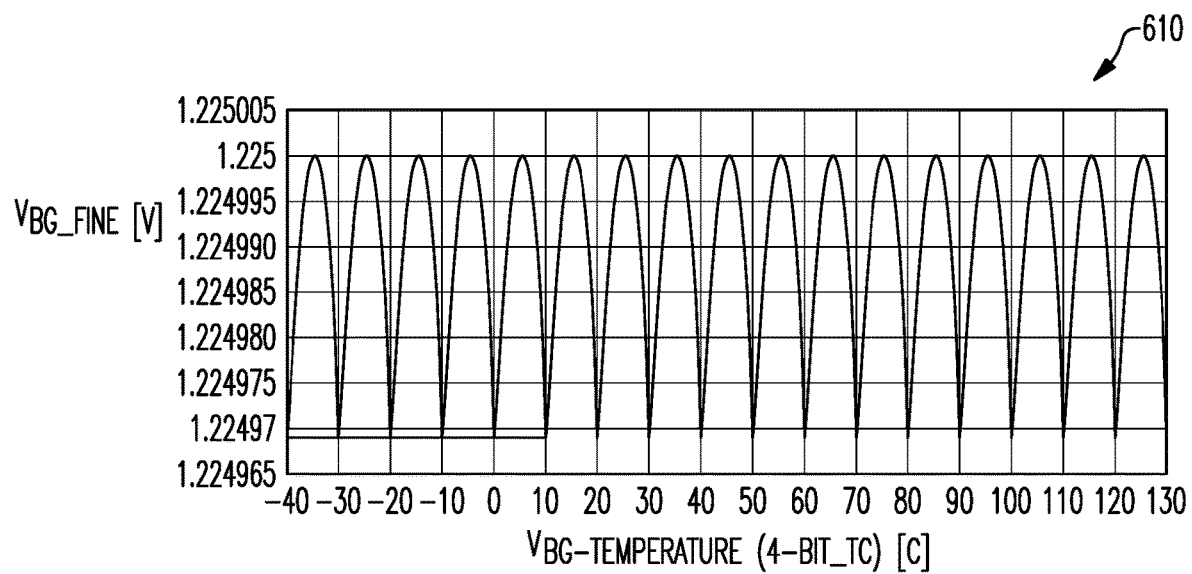
FIG. 6E illustrates an example graph of an output bandgap reference signal for a bandgap reference system that can implement at least seventeen modes of operation in accordance with one or more embodiments.

FIG. 6E illustrates an example graph 610 of an output bandgap reference signal for a bandgap reference system that can implement at least seventeen modes of operation. For example, the bandgap reference system can implement a first mode for a temperature range from −40° C. to −30° C., a second mode for a temperature range from −30° C. to −20° C., a third mode for a temperature range from −20° C. to −10° C., and so on. Here, the bandgap reference system can automatically switch modes at −30° C., −20° C., −10° C., 0° C., 10° C., 20° C., 30° C., 40° C., 50° C., 60° C., 70° C., 80° C., 90° C., 100° C., 110° C., 120° C., and 130° C. As illustrated, the temperatures −35° C., −25° C., −15° C., −5° C., 5° C., 15° C., 25° C., 35° C., 45° C., 55° C., 65° C., 75° C., 85° C., 95° C., 105° C., 115° C., and 125° C. represent zero-TC points. As also illustrated, the output bandgap reference voltage $V_{BG\_FINE}$ varies by about 32 µV over the temperature range from −40° C. to 120° C. (exhibiting a TC of about 0.15 ppm/C).

Figure 7:
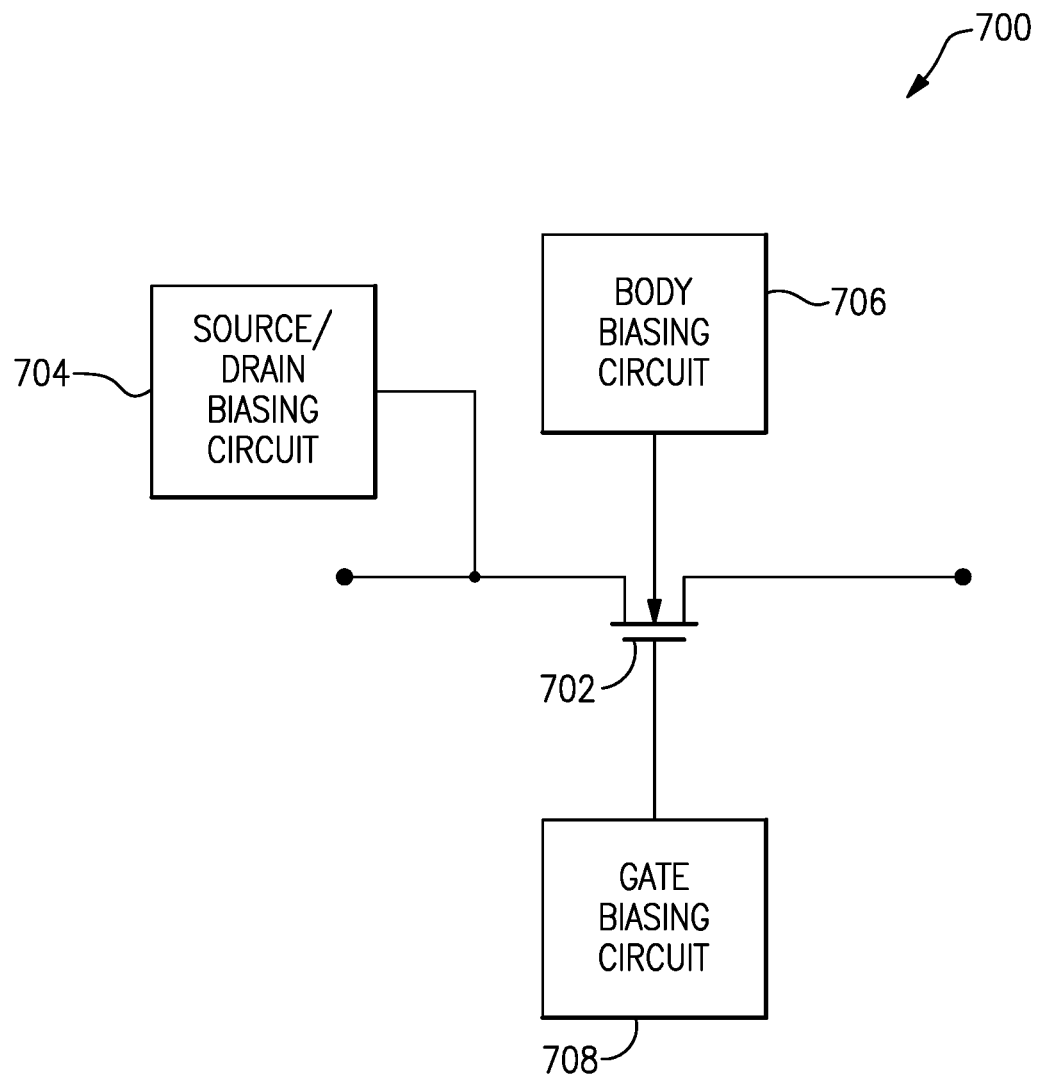
FIG. 7 illustrates example biasing circuitry for a transistor in accordance with one or more embodiments.

FIG. 7 illustrates example biasing circuitry 700 for a transistor 702. In this example, a source and/or drain of the transistor 702 is connected to a source/drain biasing circuit 704 that applies a biasing voltage to the source and/or drain of the transistor 702, a body of the transistor 702 is connected to a body biasing circuit 706 that applies a biasing voltage to the body of the transistor 702, and a gate of the transistor 702 is connected to a gate biasing circuit 708 that applies a biasing voltage to the gate of the transistor 702. The source/drain biasing circuit 704, the body biasing circuit 706, and/or the gate biasing circuit 708 can apply voltages that are more or less than a value to control the transistor 702 (e.g., place the transistor an in ON or OFF state).

In examples, the transistor 702 can be representative of any of the transistors discussed herein. That is, any of the transistors discussed herein can be biased in a similar manner as that of the example biasing circuitry 700 of the transistor 702. As such, although not illustrated in some cases, any of the transistors discussed herein can be connected to any number of biasing circuits to control the transistors.

A transistor can be implemented as a variety of types of transistors. For example, a transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), a silicon-on-insulator (SOI) FET, and so on. Further, a transistor can include a Bipolar junction transistor (BJT) (e.g., an NPN transistor, a PNP transistor, etc.), such as a heterojunction bipolar transistor (HBT), etc. For ease of illustration, many examples are shown with a transistor implemented as a FET, such as a p-type or n-type FET. However, other types of transistors can be implemented. Further, the types of FETs can be changed in some examples (e.g., a n-type FET can be used in instead of a p-type FET, and vice versa).

In some examples, a transistor is implemented as a transistor stack. A transistor stack can include a plurality of transistors connected in series. A number of transistors in a stack can be scaled based on power requirements, such as to handle various power capabilities.

Figure 8:
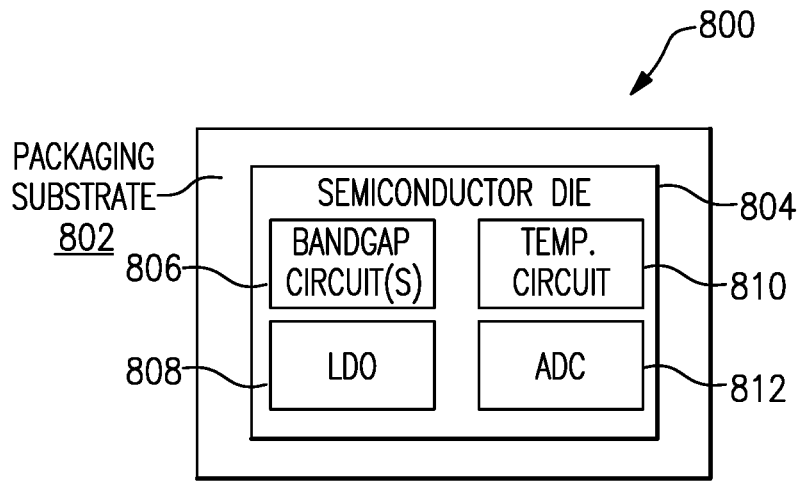
FIG. 8 illustrates an example radio-frequency module in accordance with one or more embodiments.

FIG. 8 illustrates an example radio-frequency module 800. The radio-frequency module 800 includes a packaging substrate 802, and a semiconductor die 804 mounted on the packaging substrate 802. The radio-frequency module 800 also includes, one or more bandgap circuits 806, a low dropout regulator 808, a temperature circuit 810, and an analog-to-digital converter 812 implemented on the semiconductor die 804. In some examples, the radio-frequency module 800 can be a front-end module (FEM). The radio-frequency module 800 can facilitate, for example, multi-band, multi-mode operation of a radio-frequency device.

Figure 9:
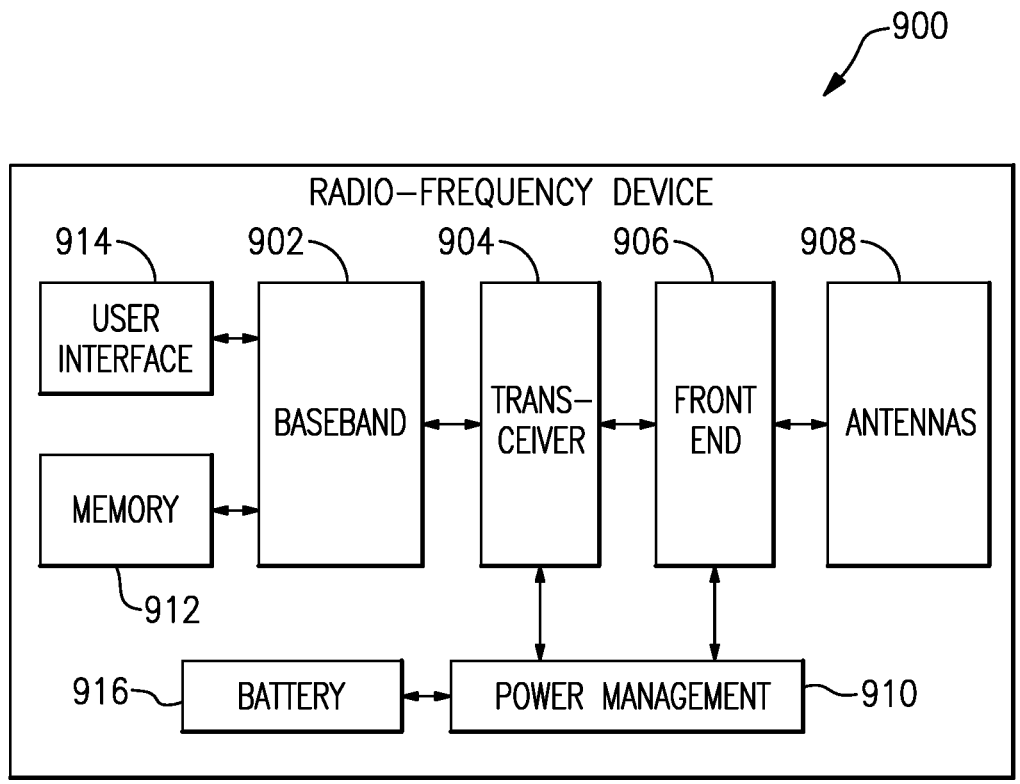
FIG. 9 illustrates an example radio-frequency device in accordance with one or more embodiments.

FIG. 9 illustrates an example radio-frequency device 900. The radio-frequency device 900 includes a baseband system 902, a transceiver 904, a front end system 906, antennas 908, a power management system 910, a memory 912, a user interface 914, and a battery 916. The baseband system 902, the transceiver 904, the front end system 906, the antennas 908, the power management system 910, the memory 912, the user interface 914, and/or the battery 916 can be in communication with each other.

The radio-frequency device 900 can include one or more bandgap reference systems or circuits implemented in accordance with the features discussed herein. For example, the front end system 906 can include one or more bandgap reference systems or circuits. Additionally, or alternatively, the baseband system 902, the transceiver 904, the antennas 908, the power management system 910, the memory 912, the user interface 914, and/or the battery 916 can include one or more bandgap reference systems or circuits.

The radio-frequency device 900 can communicate using a wide variety of communications technologies, including, but not limited to, 2G, 3G, 4G (including Long Term Evolution (LTE), LTE-Advanced, and LTE-Advanced Pro), 5G NR, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), and/or satellite-based radio navigation systems (for instance, Global Positioning System (GPS) technologies).

The transceiver 904 can generate radio-frequency (RF) signals for transmission and process incoming RF signals received from the antennas 908. It will be understood that various functionalities associated with the transmission and receiving of RF signals can be achieved by one or more components that are collectively represented in FIG. 9 as the transceiver 904. In one example, separate components (for instance, separate circuits or dies) can be provided for handling certain types of RF signals.

The front end system 906 can aid in conditioning signals transmitted to and/or received from the antennas 908. In examples, the front end system 906 can be implemented as a front end module (FEM). The front end system 906 can include one or more power amplifiers (PAS), low noise amplifiers (LNAs), filters, switches, and/or duplexers. However, other implementations are possible.

The front end system 906 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any combination thereof.

In examples, the radio-frequency device 900 supports carrier aggregation, thereby providing flexibility to increase peak data rates. Carrier aggregation can be used for both Frequency Division Duplexing (FDD) and Time Division Duplexing (TDD), and can be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 908 can include antennas used for a wide variety of types of communications. For example, the antennas 908 can include antennas for transmitting and/or receiving signals associated with a wide variety of frequencies and communications standards. In examples, the antennas 908 can transmit an amplified radio-frequency signal.

In examples, the antennas 908 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The radio-frequency device 900 can operate with beamforming in certain implementations. For example, the front end system 906 can include phase shifters having variable phase controlled by the transceiver 904. Additionally, the phase shifters are controlled to provide beam formation and directivity for transmission and/or reception of signals using the antennas 908. For example, in the context of signal transmission, the phases of the transmit signals provided to the antennas 908 are controlled such that radiated signals from the antennas 908 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 908 from a particular direction. In certain implementations, the antennas 908 include one or more arrays of antenna elements to enhance beamforming.

The baseband system 902 is coupled to the user interface 914 to facilitate processing of various user input and output (I/O), such as voice and data. The baseband system 902 provides the transceiver 904 with digital representations of transmit signals, which the transceiver 904 processes to generate RF signals for transmission. The baseband system 902 also processes digital representations of received signals provided by the transceiver 904. As shown in FIG. 9, the baseband system 902 is coupled to the memory 912 of facilitate operation of the radio-frequency device 900.

The memory 912 can be used for a wide variety of purposes, such as storing data and/or instructions to facilitate the operation of the radio-frequency device 900 and/or to provide storage of user information.

The power management system 910 provides a number of power management functions of the radio-frequency device 900. The power management system 910 can provide power to any number of components of the radio-frequency device 900. In examples, the power management system 910 includes a PA supply control circuit that controls the supply voltages of one or more power amplifiers. For example, the power management system 910 can be configured to change the supply voltage(s) provided to one or more power amplifiers to improve efficiency, such as power added efficiency (PAE).

As shown in FIG. 9, the power management system 910 receives a battery voltage from the battery 916. The battery 916 can be any suitable battery for use in the radio-frequency device 900, including, for example, a lithium-ion battery.

The radio-frequency device 900 can include a wide variety of devices that are configured to communicate wirelessly. For example, the radio-frequency device 900 can include a cellular phone, a smart-phone, a hand-held wireless device with or without phone functionality, a wireless tablet, a wearable device, a smart appliance, a smart vehicle, etc.

Although the example of FIG. 9 discusses implementing a bandgap reference system or circuit within the context of a radio-frequency device 900, a bandgap reference system or circuit can be implemented in various devices, such as a memory chip, a memory module, a circuit of optical network or another communication network, a disk driver circuit, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, an analog-to-digital converter, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Further, the word "connected" can refer to two or more elements that are either directly connected or connected by way of one or more intermediate elements. Components discussed herein can be coupled or connected in a variety of manners, such as through a conductive material. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks may be presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The features described herein can be applied to other systems, not necessarily the system described above. The elements and acts of the various embodiments described above can be combined to provide further embodiments.

While some embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. Claims and their equivalents are intended to cover such forms or modifications as would fall within the scope and spirit of the disclosure.

What is claimed is:

1. A bandgap reference system comprising:
   a first bandgap reference circuit configured to provide a first bandgap reference voltage, the first bandgap reference circuit being associated with a first amount of reference voltage variation over a temperature range;
   a low dropout regulator coupled to the first bandgap reference circuit, the low dropout regulator configured to receive the first bandgap reference voltage and provide a regulated voltage based at least in part on the first bandgap reference voltage;
   a temperature circuit coupled to the low dropout regulator, the temperature circuit configured to receive the regulated voltage and output a temperature signal indicating a temperature; and
   a second bandgap reference circuit coupled to the low dropout regulator and the temperature circuit, the second bandgap reference circuit configured to configure one or more impedance elements based at least in part on the temperature signal and provide a second bandgap reference voltage based at least in part on one or more currents that pass through the one or more impedance elements, the second bandgap reference circuit being associated with a second amount of reference voltage variation over the temperature range, the second amount of reference voltage variation being less than the first amount of reference voltage variation.

2. The bandgap reference system of claim 1 wherein the temperature circuit includes a voltage generation circuit configured to generate a Proportional-to-Absolute-Temperature (PTAT) voltage, a slope converter circuit to convert the PTAT voltage, and a voltage follower circuit to output the converted PTAT voltage as the temperature signal.

3. The bandgap reference system of claim 1 further comprising an analog-to-digital converter coupled to the temperature circuit, the analog-to-digital converter configured to receive the temperature signal from the temperature circuit, convert the temperature signal, and provide the converted temperature signal to the second bandgap reference circuit.

4. The bandgap reference system of claim 1 wherein the second bandgap reference circuit includes a current generation circuit configured to generate a Proportional-to-Absolute-Temperature (PTAT) current and provide the PTAT current to a node.

5. The bandgap reference system of claim 4 wherein the second bandgap reference circuit includes an input bandgap circuit coupled to the node, the input bandgap circuit configured to receive an input bandgap reference voltage from the first bandgap reference circuit, convert the input bandgap reference voltage to an input bandgap reference current, and provide a first current to the node based at least in part on the temperature signal, the first current being associated with the input bandgap reference current.

6. The bandgap reference system of claim 5 wherein the one or more currents that pass through the one or more impedance elements include the PTAT current and the first current.

7. The bandgap reference system of claim 1 wherein the second bandgap reference circuit includes one or more transistors coupled to the one or more impedance elements, the second bandgap reference circuit is configured to configure the one or more impedance elements by controlling the one or more transistors based at least in part on the temperature signal.

8. The bandgap reference system of claim 1 wherein the second bandgap reference circuit includes a start-up circuit configured to receive the regulated voltage from the low dropout regulator and power-up the second bandgap reference circuit based at least in part on the regulated voltage.

9. A bandgap reference circuit comprising:
  a current generation circuit to generate a Proportional-to-Absolute-Temperature (PTAT) current and provide the PTAT current to a node;
  an input bandgap circuit coupled to the node, the input bandgap circuit to receive an input bandgap reference voltage from another bandgap reference circuit and control a first current to the node based at least in part on a temperature signal, the first current being associated with the input bandgap reference voltage, the bandgap reference circuit being associated with a first amount of reference voltage variation over a temperature range and the other bandgap reference circuit being associated with a second amount of reference voltage variation over the temperature range, the first amount of reference voltage variation being less than the second amount of reference voltage variation; and
  a reference voltage circuit coupled to the node and including one or more impedance elements, the reference voltage circuit to configure the one or more impedance elements based at least in part on the temperature signal, receive a second current via the node, and provide an output bandgap reference voltage based at least in part on the second current passing through the one or more impedance elements.

10. The bandgap reference circuit of claim 9 wherein the input bandgap circuit includes a voltage-to-current circuit to receive the input bandgap reference voltage from the other bandgap reference circuit and generate an input bandgap reference current based at least in part on the input bandgap reference voltage.

11. The bandgap reference circuit of claim 10 wherein the input bandgap circuit includes a current digital-to-analog converter to receive the input bandgap reference current from the voltage-to-current circuit, generate the first current based at least in part on the input bandgap reference current, and provide the first current to the node.

12. The bandgap reference circuit of claim 11 wherein the reference voltage circuit includes one or more transistors coupled to the one or more impedance elements, the reference voltage circuit is configured to configure the one or more impedance elements by controlling the one or more transistors based at least in part on the temperature signal.

13. The bandgap reference circuit of claim 12 further comprising a start-up circuit to receive a voltage from a low dropout regulator and power-up the bandgap reference circuit based at least in part on the received voltage, the received voltage being based at least in part on the input bandgap reference voltage from the other bandgap reference circuit.

14. The bandgap reference circuit of claim 9 wherein the second current includes the PTAT current and the first current.

15. A radio-frequency module comprising:
  a packaging substrate configured to receive a plurality of components; and
  a semiconductor die mounted on the packaging substrate, the semiconductor die including a bandgap reference circuit that includes a current generation circuit, an input bandgap circuit coupled to a node, and a reference voltage circuit coupled to the node, the current generation circuit configured to generate a Proportional-to-Absolute-Temperature (PTAT) current and provide the PTAT current to the node, the input bandgap circuit configured to receive an input bandgap reference voltage associated with another bandgap reference circuit and control a first current to the node based at least in part on a temperature signal, the first current being associated with the input bandgap reference voltage, the reference voltage circuit including one or more impedance elements, the reference voltage circuit configured to configure the one or more impedance elements based at least in part on the temperature signal, receive a second current via the node, and provide an output bandgap reference voltage based at least in part on the second current passing through the one or more impedance elements, the bandgap reference circuit being associated with a first amount of reference voltage variation over a temperature range and the other bandgap reference circuit being associated with a second amount of reference voltage variation over the temperature range, the first amount of reference voltage variation being less than the second amount of reference voltage variation.

16. The radio-frequency module of claim 15 further comprising the other bandgap reference circuit configured to provide the input bandgap reference voltage.

17. The radio-frequency module of claim 16 further comprising a low dropout regulator coupled to the other bandgap reference circuit, the low dropout regulator configured to receive the input bandgap reference voltage and provide a regulated voltage based at least in part on the input bandgap reference voltage.

18. The radio-frequency module of claim 17 further comprising a temperature circuit coupled to the low dropout regulator, the temperature circuit configured to receive the regulated voltage and output the temperature signal.

* * * * *